(12) United States Patent
Kanzawa et al.

(10) Patent No.: US 6,645,836 B2
(45) Date of Patent: Nov. 11, 2003

(54) METHOD OF FORMING A SEMICONDUCTOR WAFER HAVING A CRYSTALLINE LAYER THEREON CONTAINING SILICON, GERMANIUM AND CARBON

(75) Inventors: Yoshihiko Kanzawa, Kadoma (JP); Katsuya Nozawa, Osaka (JP); Tohru Saitoh, Settsu (JP); Minoru Kubo, Nabari (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 93 days.

(21) Appl. No.: 09/979,305

(22) PCT Filed: May 27, 2001

(86) PCT No.: PCT/JP01/02523

§ 371 (c)(1),
(2), (4) Date: Nov. 21, 2001

(87) PCT Pub. No.: WO01/73827

PCT Pub. Date: Oct. 4, 2001

(65) Prior Publication Data

US 2002/0160584 A1 Oct. 31, 2002

(30) Foreign Application Priority Data

Mar. 27, 2000 (JP) .................................... 2000-086117

(51) Int. Cl.⁷ ............... H01L 21/30; H01L 21/36; H01L 29/06; H01L 29/12
(52) U.S. Cl. ................. 438/509; 148/33.4; 148/33.5
(58) Field of Search ................. 148/33.4, 33.5; 438/507, 509

(56) References Cited

U.S. PATENT DOCUMENTS 5,906,708 A * 5/1999 Robinson et al. .. 148/DIG. 150

FOREIGN PATENT DOCUMENTS

| JP | 06224127 A | * | 8/1994 | ......... H01L/21/205 |
| JP | 07022330 A | * | 1/1995 | ......... H01L/21/205 |
| JP | 11233440 A | * | 8/1999 | ........... H01L/21/20 |

OTHER PUBLICATIONS

Van Zant, Microchip Fabrication, 4th ed, McGraw–Hill: New York, 2000, pp. 179–182.*

Warren et al. "Thermal stability of Si/Si1–x–yGexCy/Si heterostructures grown by rapid thermal chemical vapor deposition" Journal of Crystal Growth 157, 1995, pp. 414–419.*

Liu et al. "Thermal stability of Si/Si1–x–yGexCy/Si quantum wells grown by rapid thermal chemical vapor deposition" Journal of Applied Physics 85(4), Feb. 1999, pp. 2124–2128.*

International Search Report of PCT/JP01/02523, dated Jun. 26, 2001.*

* cited by examiner

Primary Examiner—Erik Kielin
(74) Attorney, Agent, or Firm—Nixon Peabody LLP; Donald R. Studebaker

(57) ABSTRACT

A Si substrate 1 with a SiGeC crystal layer 8 deposited thereon is annealed to form an annealed SiGeC crystal layer 10 on the Si substrate 1. The annealed SiGeC crystal layer includes a matrix SiGeC crystal layer 7, which is lattice-relieved and hardly has dislocations, and Sic microcrystals 6 dispersed in the matrix SiGeC crystal layer 7. A Si crystal layer is then deposited on the annealed SiGeC crystal layer 10, to form a strained Si crystal layer 4 hardly having dislocations.

10 Claims, 6 Drawing Sheets

METHOD OF FORMING A SEMICONDUCTOR WAFER HAVING A CRYSTALLINE LAYER THEREON CONTAINING SILICON, GERMANIUM AND CARBON

TECHNICAL FIELD

The present invention relates to a method for fabricating a semiconductor wafer, and more particularly, to a method for fabricating a semiconductor wafer including a semiconductor crystal layer having strain.

BACKGROUND ART

Semiconductor devices using a bulk Si crystal have attained improved multifunctionality and high-speed capability in succession. This attainment is greatly attributed to scale-down of devices. Further device scale-down is required for continuing improvement in device performance in the future. In order to pursue further device scale-down, however, there exist many problems to be technically overcome. If device scale-down proceeds successfully, the optimal performance of the resultant devices is restricted by the physical properties (for example, mobility) of the bulk Si crystal as the material. In other words, as long as the bulk Si crystal is used as the material, it is difficult to dramatically improve the device performance.

In recent years, attempts of using a material other than the bulk Si crystal have been made to improve the device characteristics. One of such attempts is using a new material having a mobility greater than that of Si, such as a mixed crystal of silicon and germanium (SiGe) and a mixed crystal of silicon, germanium, and carbon (SiGeC). Another attempt is using a strained Si crystal. This is an approach of providing a new factor, strain, to a Si crystal to reduce scattering of carrier electrons called intervalley scattering and thus improve the mobility. The latter attempt, in particular, has also received attention from the industrial standpoint, for the reasons that improvement in performance is attained only by giving strain to the bulk Si crystal and that necessary machining of the device can be made only using the existing Si process technology (for example, oxidation and etching process technology).

Conventionally, a strained Si crystal as described above is produced by depositing a thick SiGe crystal layer on a Si substrate made of a bulk Si crystal and then depositing a Si crystal on the SiGe crystal layer. In general, when a SiGe crystal, which has a lattice constant greater than Si, is epitaxially grown on a Si substrate in the state that the lattice in the plane of the substrate is aligned with Si, a considerably large compressible strain is generated in the SiGe crystal. Once the thickness of the SiGe crystal deposited on the Si substrate exceeds a certain thickness (critical thickness), dislocations are generated between the Si substrate and the SiGe layer, and the strain is relieved. As a result, the in-plane lattice constant of the SiGe layer becomes greater than that at the surface of the Si substrate. When a Si crystal layer is epitaxially grown on the SiGe crystal layer, the in-plane lattice constant of the newly deposited Si matches with that of the strain-relieved SiGe crystal, and therefore the Si layer has a lattice constant greater than the inherent lattice constant of Si. As a result, a strained Si crystal layer undergoing tensile stress is produced (hereinafter, a crystal layer that causes lattice relieving and has an interstitial distance greater than a Si substrate, such as the SiGe crystal described above, is called a relieved buffer layer).

A conventional method for forming a strained Si crystal layer on a substrate will be described in more detail with reference to the relevant drawing.

FIG. 1 is a cross-sectional view of a substrate on which a strained Si crystal layer has been formed by a conventional method. To fabricate the substrate including the strained Si crystal layer, first, a SiGe crystal layer 103 having a thickness of several micrometers or more that exceeds a critical thickness is epitaxially grown on a Si substrate 101 by CVD. By this growth, dislocations are generated in the SiGe crystal layer 103, and thus the SiGe crystal layer 103 is subjected to lattice relieving. Thereafter, a Si crystal is deposited on the SiGe crystal layer 103 by CVD, to form a strained Si crystal layer 104.

PROBLEMS TO BE SOLVED

In the conventional technique described above, a large defect running through the crystal layer (a through dislocation 105) is generated during the formation of the relieved buffer layer made of the SiGe crystal layer 103 having a thickness greater than a critical thickness. The through dislocation 105 may even enter the strained Si crystal layer 104, according to the circumstances, and lead to formation of a defect in the strained Si crystal layer 104. Such a defect in the crystal layer may become a factor impeding improvement of the device characteristics.

To solve the above problem, structures in which the content of Ge in the SiGe crystal layer 103 is changed in stages or in a gradual manner are often used to reduce the density of the through dislocation 105. In any of these structures, however, in order to reduce the density of dislocations, it is necessary to deposit a SiGe crystal layer to a thickness as large as several micrometers while changing the Ge content of the SiGe crystal layer. Long-time crystal growth is required to form such a thick relieved buffer layer, and therefore, cost reduction in wafer fabrication is difficult. For this reason, conventionally, it is considered difficult to use a strained Si crystal for practical fabrication of semiconductor devices.

DISCLOSURE OF THE INVENTION

An object of the present invention is proposing a structure and formation method of a relieved buffer layer having a reduced density of crystal defects, and thereby fabricating a semiconductor wafer including a strained Si layer and the like used as a substrate of a semiconductor device.

The semiconductor wafer of the present invention includes: a substrate made of a Si crystal; and a crystal layer formed on the substrate, the crystal layer having a lattice constant in the plane greater than the lattice constant of the substrate, wherein at least part of the crystal layer is a crystal of Si, Ge, and C with SiC crystals dispersed in the crystal.

With the above construction, the crystal layer having a lattice constant in the plane greater than the lattice constant of the substrate made of Si crystal can be used as the relieved buffer layer. Therefore, a strained Si crystal layer can be formed on the relieved buffer layer. The semiconductor wafer with the above construction can be used as a substrate of a semiconductor device The semiconductor wafer described above further includes a strained Si crystal layer formed on the crystal layer. When this semiconductor wafer is used as a substrate of a semiconductor device, since the carrier mobility in the strained Si crystal layer is greater than the carrier mobility in a bulk Si crystal, the resultant semiconductor device can exhibit improved performance compared with a semiconductor device using a bulk Si crystal as the substrate.

The first method for fabricating a semiconductor wafer of the present invention includes the steps of: (a) depositing a crystal layer on a substrate made of a Si crystal, at least part of the crystal layer containing Si, Ge, and C; and (b) annealing the substrate including the deposited crystal layer to relieve the lattice of the crystal layer and precipitate SiC crystals in the crystal layer.

By the above method, it is possible to fabricate a semiconductor wafer that uses the crystal layer containing Si, Ge, and C as the relieved buffer layer and enables formation of a strained Si crystal layer hardly having dislocations at positions on the relieved buffer layer.

In particular, in step (b), by annealing the substrate to precipitate SiC, it is possible to suppress generation of a through dislocation in the crystal layer as the relieved buffer layer. It is also possible to reduce the thickness of the relieved buffer layer compared with the conventional relieved buffer layer requiring to be as thick as about several micrometers. This enables mass-production of the semiconductor wafer on which a strained Si crystal layer can be formed.

The first method described above further includes the step of: (c) forming a strained Si crystal layer on the annealed crystal layer including the SiC crystals. By this method, it is possible to fabricate a semiconductor wafer including a relieved buffer layer containing Si, Ge, and C and a strained Si crystal layer. By using this semiconductor wafer as a substrate of a semiconductor device, the semiconductor device can exhibit improved performance compared with a semiconductor device using a bulk Si crystal as the substrate.

The second method for fabricating a semiconductor wafer of the present invention includes the steps of: (a) depositing a crystal layer on a substrate made of a Si crystal, at least part of the crystal layer containing Si, Ge, and C; (b) depositing a Si crystal layer on the crystal layer; and (c) annealing the substrate to precipitate SiC crystals in the crystal layer and strain the Si crystal layer.

By the above method, as in the first method described above, it is possible to fabricate a semiconductor wafer including a relieved buffer layer containing Si, Ge, and c and a strained Si crystal layer. By using this semiconductor wafer as a substrate of a semiconductor device, the semiconductor device can exhibit improved performance compared with a semiconductor device using a bulk Si crystal as the substrate.

BEST MODE FOR CARRYING OUT THE INVENTION

Hereinafter, a best-mode embodiment of the present invention will be described with reference to the accompanying drawings.

Figure 1:
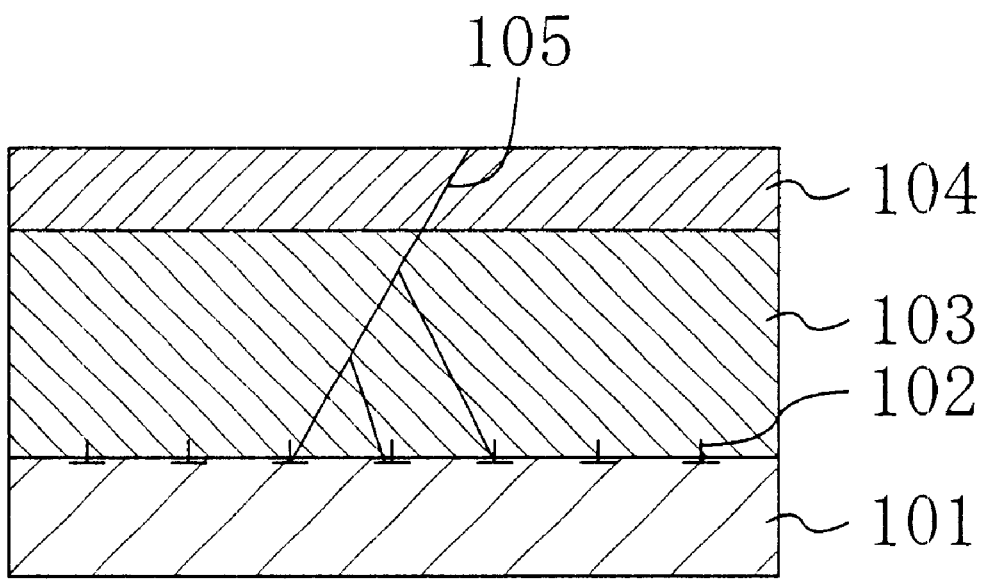
FIG. 1 is a cross-sectional view of a conventional substrate structure for obtaining a strained Si crystal.
Figure 2:
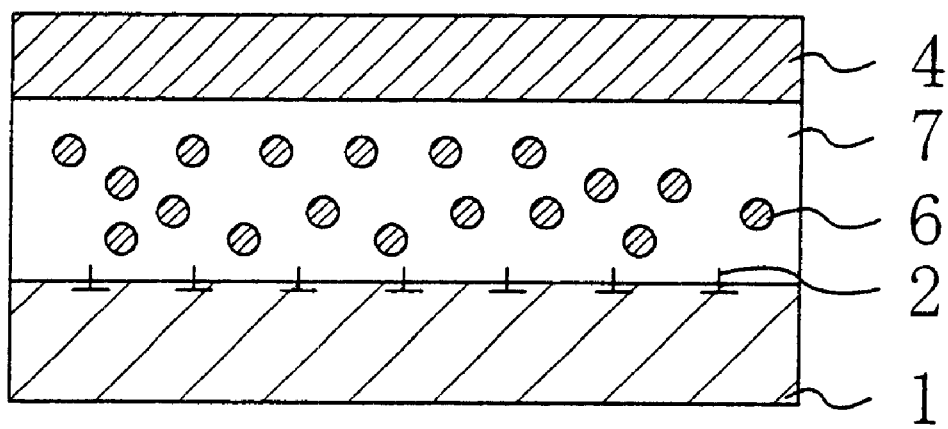
FIG. 2 is a cross-sectional view of a semiconductor wafer including a strained Si crystal layer, fabricated in an embodiment of the present invention.

FIG. 2 is a cross-sectional view of a semiconductor wafer of this embodiment. As shown in FIG. 2, the semiconductor wafer of the embodiment of the present invention includes a Si substrate 1 made of a bulk Si crystal, an annealed SiGeC crystal layer 10 having a thickness of about 130 nm formed on the Si substrate 1, a Si crystal layer 9 having a thickness of about 4 nm formed on the annealed SiGeC crystal layer 10, and a strained Si crystal layer 4 formed on the Si crystal layer 9.

The annealed SiGeC crystal layer 10 includes a matrix SiGeC crystal layer 7 formed on the Si substrate 1 and SiC microcrystals 6 having a diameter of about 2 to 3 nm dispersed in the matrix SiGeC crystal layer 7.

Defects 2 suspected of being dislocations are present in a region of the matrix SiGeC crystal layer 7 within 20 nm from the interface with the Si substrate 1.

A feature of the wafer of this embodiment is to use the annealed SiGeC crystal layer 10 including the SiC microcrystals 6 and the matrix SiGeC crystal layer 7 as the relieved buffer layer.

The lattice constant of the lattice-relieved matrix SiGeC crystal layer 7 is greater than the lattice constant of Si. Therefore, although the thickness of the relieved buffer layer is as small as about 130 nm, it is possible to form the strained Si crystal layer 4 by growing the Si crystal layer 9 on the annealed SiGeC crystal layer 10.

In addition, in the semiconductor wafer of this embodiment, the crystal defects 2 suspected of being dislocations are confined in the region within 20 nm from the interface between the Si substrate 1 and the annealed SiGeC crystal layer 10. No through dislocation is observed. The evidence of this, as well as the reasoning by the present inventors on why no through dislocation is generated, will be described later.

With no through dislocation observed in the annealed SiGeC crystal layer 10, a highly-reliable, high-performance semiconductor device can be fabricated using the semiconductor wafer of this embodiment. For example, it is possible to fabricate a field effect transistor having a Si/SiGeC heterostructure in which a gate oxide film and a gate electrode are formed on the strained Si crystal layer 4.

Although the thickness of the Si crystal layer 4 is set at 4 nm in this embodiment, it is not specifically limited. The Si crystal layer 9 may not necessarily be formed on the annealed SiGeC crystal layer 10 and the strained Si crystal layer 4 may be directly formed on the annealed SiGeC crystal layer 10. Alternatively, a SiGe crystal or a SiGeC crystal may be formed under the strained Si crystal layer 4 and on the Si crystal layer 9.

In this embodiment, the wafer including the strained Si crystal layer 4 was described. Alternatively, the wafer may be provided to the user at the stage where the strained Si crystal layer 4 has not been formed.

The composition of the SiGeC crystal in the semiconductor wafer of this embodiment is 68.3% of Si, 30.5% of Ge, and 1.2% of C, as will be described later. The contents of these atoms are not limited to these.

In this embodiment, the thickness of the annealed SiGeC crystal layer 10 as the relieved buffer layer is 130 nm. For the purpose of suppressing dislocations from appearing on the substrate surface, a thickness more than 20 nm is enough for the annealed SiGeC crystal layer 10. Alternatively, the thickness of the annealed SiGeC crystal layer 10 may exceed 130 nm.

A method for fabricating a semiconductor wafer of the embodiment of the present invention will be described with reference to FIGS. 3A through 3D. FIGS. 3A through 3D are cross-sectional views illustrating a fabrication process of the semiconductor wafer of the embodiment of the present invention.

First, in the step shown in FIG. 3A, the surface of the Si substrate 1 in (001) face is cleaned in the following manner. The surface of the Si substrate 1 is cleaned with a mixed solution of sulfuric acid—hydrogen peroxide aqueous solution, to remove organic substances and metallic contaminants on the surface of the Si substrate 1. The surface of the Si substrate 1 is then cleaned with a solution of ammonia—hydrogen peroxide aqueous solution, to remove attachments on the surface of the Si substrate 1. Subsequently, a naturally-oxidized film on the surface of the Si substrate 1 is removed with hydrofluoric acid. The resultant Si substrate 1 is immersed in the solution of ammonia—hydrogen peroxide aqueous solution again, to form a thin protection oxide film on the surface of the Si substrate 1.

Figure 3A:
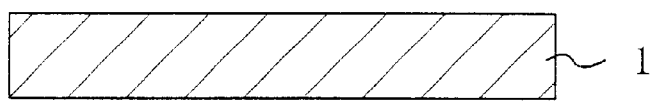
FIGS. 3A through 3D are cross-sectional views illustrating a fabrication process of a semiconductor wafer of the embodiment of the present invention.
Figure 3A:
Figure 3B:
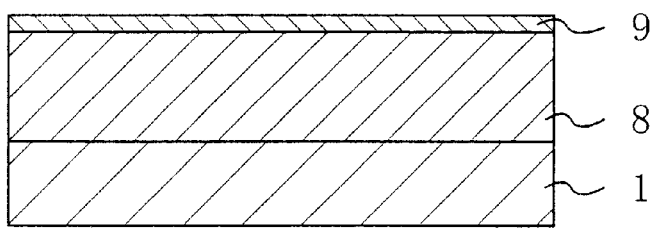
Figure 3B:

In the step shown in FIG. 3B, the surface-cleaned Si substrate 1 is put in an ultrahigh vacuum chemical vapor deposition (UHV-CVD) apparatus, and the inside of the UHV-CVD apparatus is decompressed to as low as $2.6 \times 10^{-7}$ Pa ($2 \times 10^{-9}$ Torr). The Si substrate 1 is then heated to a temperature of 800° C. in a hydrogen gas atmosphere, to remove the protection oxide film and thus expose the cleaned surface of the Su substrate 1. Subsequently, the temperature of the Si substrate 1 is decreased to 490° C., and while keeping this temperature, disilane ($Si_2H_6$) gas, germane ($GeH_4$) gas, and methylsilane ($SiCH_6$) gas as material sources of Si, Ge, C, respectively, are introduced into the UHV-CVD apparatus, to permit epitaxial growth of a SiGeC crystal on the Si substrate 1 for 15 minutes, so that the SiGeC crystal layer 8 having a thickness of about 130 nm is deposited. The pressures of the gases during this process are $9.1 \times 10^{-3}$ Pa ($7 \times 10^{-5}$ Torr) for the $Si_2H_6$ gas, $4.2 \times 10^{-2}$ Pa ($3 \times 10^{-4}$ Torr) for the $GeH_4$ gas, and $1.2 \times 10^{-3}$ Pa ($9 \times 10^{-6}$ Torr) for the $SiCH_6$ gas. The feeding of the $GeH_4$ gas and the $SiCH_6$ gas is then stopped, and after the substrate temperature is temporarily raised to 550° C., only the $Si_2H_6$ gas is fed at a pressure of $3.2 \times 10^{-2}$ Pa ($2.4 \times 10^{-4}$ Torr) for 2 minutes, to deposit the Si crystal layer 9 having a thickness of about 4 nm. The Si crystal layer 9 serves as a protection film for preventing Ge and C atoms from flowing out to a process apparatus such as a cleaning apparatus used in the next step and contaminating the apparatus.

In this embodiment, the thickness of the Si crystal layer 9 deposited on the SiGeC crystal layer 8 was set at 4 nm. However, it may be thicker or thinner than 4 nm without causing any problem against prevention of contamination. The deposition of the Si crystal layer 9 may even be omitted depending on the structure of the apparatus. Alternatively, a SiGe crystal or a SiGeC crystal may be formed on the Si crystal layer 9.

In this embodiment, the UHV-CVD method was employed for the crystal growth. Alternatively, a LRP apparatus, a RT-CVD apparatus, or the like may be used.

Although the Si wafer in (001) face was used as the substrate in this embodiment, a Si wafer having a different crystal face may be used.

Figure 4:
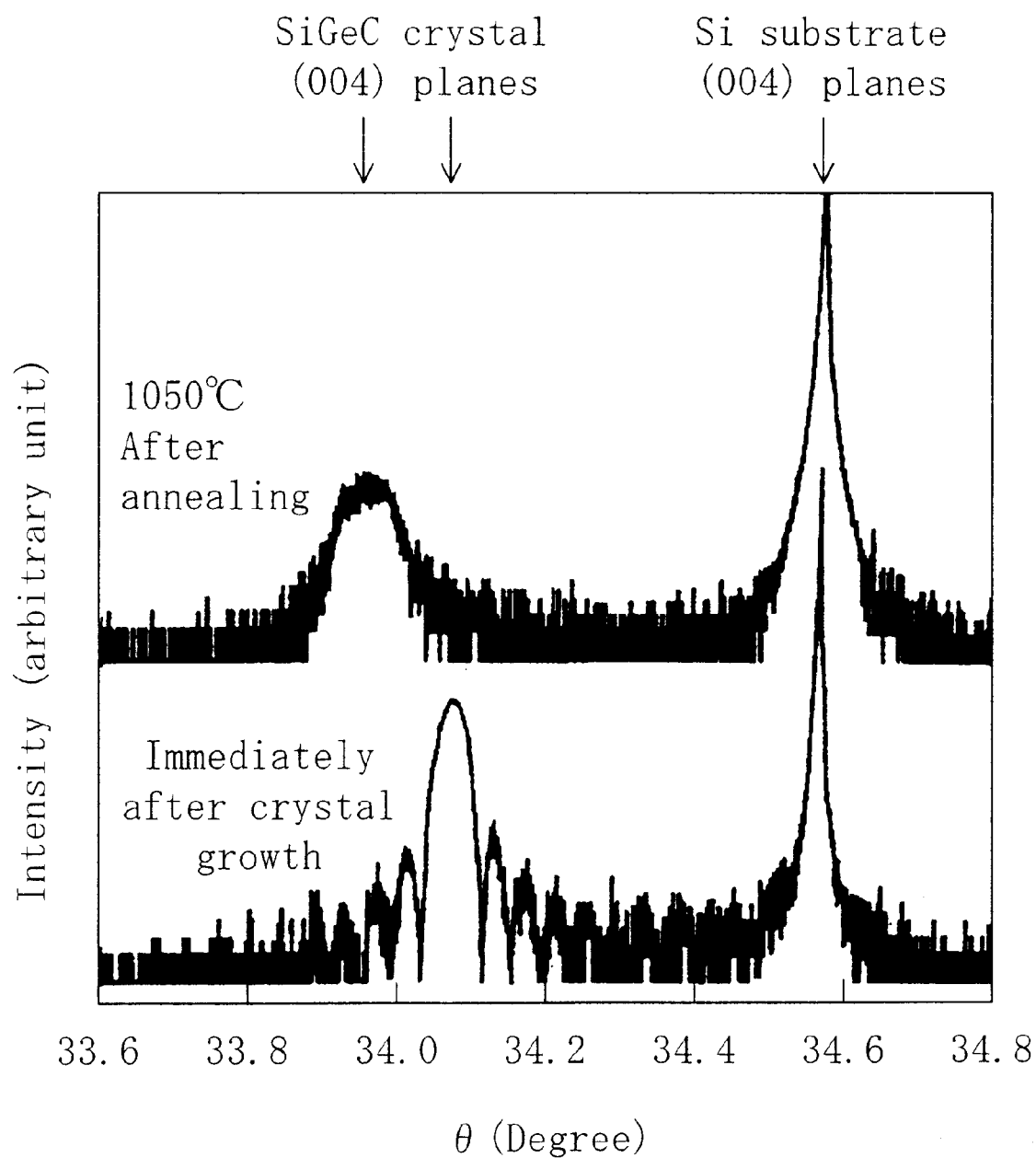
FIG. 4 is a view showing X-ray diffraction (XRD) spectra of a SiGeC crystal measured immediately after deposition on a Si substrate and after annealing, in the semiconductor wafer of the embodiment of the present invention.

Before proceeding to the next step, the crystal state immediately after the growth of the SiGeC crystal will be described. FIG. 4 shows XRD spectra of the SiGeC crystal measured immediately after the growth on the Si substrate and after annealing.

The lower part of FIG. 4 shows the XRD spectrum of the crystal obtained from the substrate immediately after the formation of the SiGeC crystal layer 8 and the Si crystal layer 9 in the step shown in FIG. 3B. In this spectrum, the peak observed near 34.56 degree is that caused by diffraction from (004) planes of Si used as the substrate, and the peak near 34.06 degree is that caused by the SiGeC crystal deposited on the Si substrate 1. This SiGeC crystal is considered to be in the completely strained state, that is, the state in which any lattice constant of the SiGeC crystal in directions in parallel with the Si substrate completely matches with the lattice constant of the Si substrate. The composition of the crystal was estimated from the peak angle of the X-ray diffraction spectrum using a crystal analysis technique called Vegard's Law. As a result, the crystal was found to be a SiGeC crystal containing 30.5% of Ge and about 1.2% of C. Further, from close observation of the lower spectrum in FIG. 4, it is found that small peaks exist around the peak of the SiGeC crystal near 34.06 degree. These small peaks, which constitute a fringe in the X-ray diffraction image, indicate that the crystallinity and flatness of the SiGeC crystal formed in this embodiment are very good. In order to confirm the crystallinity of the crystal, a cross-sectional view of the crystal was observed by a transmission electron microscope (TEM). And it was found that no defect or the like was observed at all at the interface between the Si substrate 1 and the deposited SiGeC crystal layer 8 and inside the SiGeC crystal layer 8.

Figure 3C:
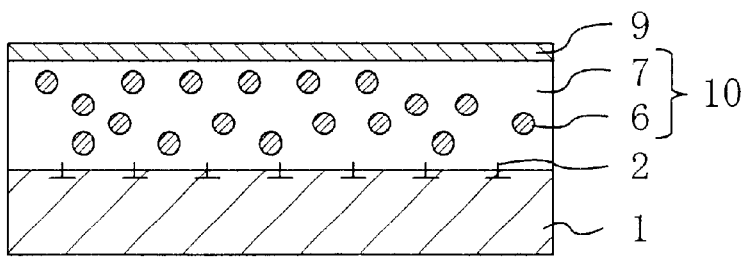
Figure 3C:

In the step shown in FIG. 3C, the substrate is taken out from the UHV-CVD apparatus, and then annealed in a nitrogen atmosphere with a halogen lamp annealing apparatus, an electric furnace annealing apparatus, or the like. The annealing is performed at 1050° C. for 15 seconds.

By the annealing, the SiGeC crystal layer 8 is phase-separated into the SiC microcrystals 6 and the matrix SiGeC crystal layer 7 as will be described later. Simultaneously, lattice relieving occurs, and as a result, the lattice constant in the plane of the matrix SiGeC crystal layer 7 becomes greater than the lattice constant of the Si substrate 1, as will be described later. By this lattice relieving, when a Si crystal layer is deposited on the annealed SiGeC crystal layer 10 in the subsequent step, the Si crystal layer can be made strained, enabling formation of the strained Si crystal layer 4.

In this embodiment, due to the existence of the SiC microcrystals 6 precipitated by annealing the substrate at 1050° C., no through dislocation is found in the annealed SiGeC crystal 10. This indicates that using the semiconductor wafer fabricated in this embodiment, it is possible to fabricate a semiconductor device with high reliability.

Although the substrate was annealed at 1050° C. in this embodiment, the annealing may be performed at a temperature at which SiC is precipitated, that is, about 950° C. or more.

In this embodiment, after the deposition of the SiGeC crystal layer 8, the substrate was temporarily taken out of the crystal growth apparatus before starting the annealing. This procedure is not necessarily followed, but the annealing may be sequentially performed in the crystal growth apparatus after the deposition of the SiGeC crystal layer 8.

Note that although in this embodiment, the strained Si crystal layer 4 is formed in the following step, this layer may not be formed, but the annealed substrate including the Si substrate 1 and the annealed SiGeC crystal layer 10 may be provided as the substrate on which an arbitrary semiconductor device is to be formed. In other words, a wafer including the Si substrate and the SiGeC crystal layer with SiC crystals dispersed therein may be provided to the user without forming the strained Si crystal layer 4.

Before proceeding to the next step, the state of the annealed SiGeC crystal will be described.

Figure 6:
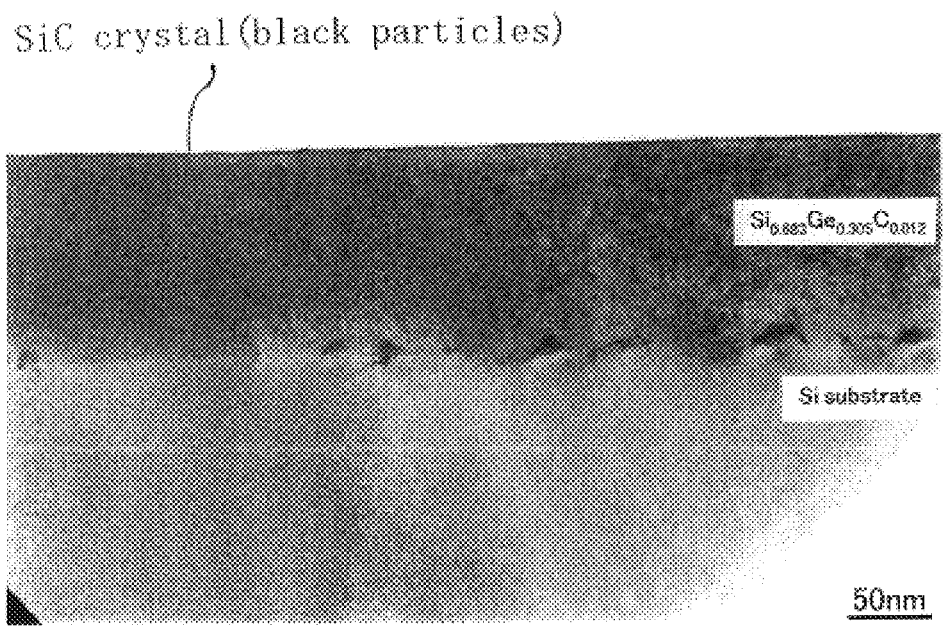
FIG. 6 is a micrograph taken by a transmission electron microscope after annealing of the SiGeC layer formed on the Si substrate according to the present invention.

FIG. 6 is a TEM micrograph showing the results of observation of a section of the substrate after annealing with a TEM. From FIG. 6, it is found that the SiC microcrystals 6 having a diameter of about 2 to 3 nm were precipitated in the region that would have otherwise maintained a uniform SiGeC crystal. The SiC microcrystals 6 were presumably generated because the metastable SiGeC crystal was phase-separated by the annealing into the Sic crystals and the SiGe crystal as stable crystals. During this phase separation, most of C atoms in the SiGeC crystal layer 8 presumably gathered to form the SiC microcrystals 6, and the portion surrounding the microcrystals 6 constituted the SiGeC crystal (matrix SiGeC crystal layer 7) having a considerably reduced C content.

In FIG. 3C, the SiC microcrystals 6 are shown as occupying a greater proportion than the actual volume proportion thereof for easy understanding. In reality, the volume proportion of the SiC microcrystals 6 in the annealed SiGeC crystal layer 10 is considerably small.

Figure 7:
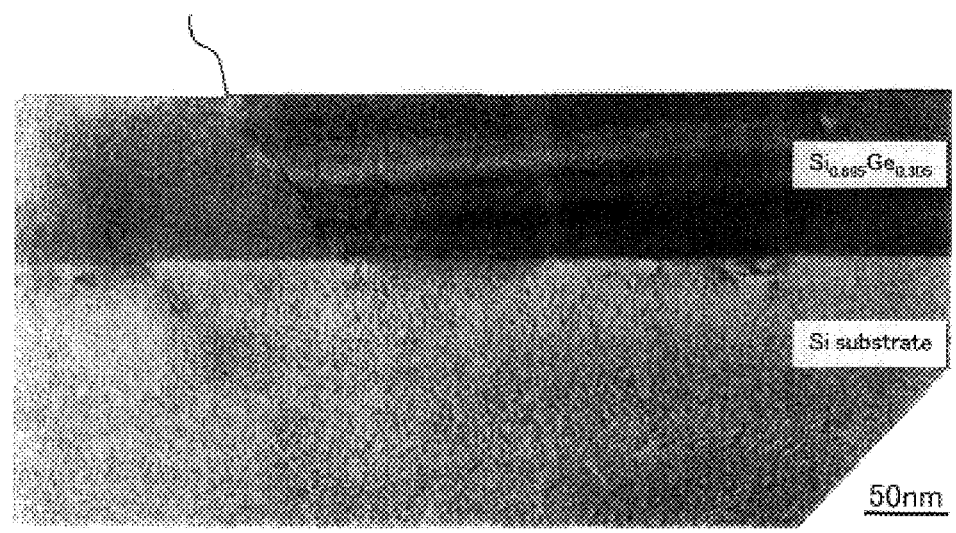
FIG. 7 is a micrograph taken by a transmission electron microscope after annealing of a SiGe crystal formed on a substrate.

In close observation of the TEM micrograph shown in FIG. 6, the defects 2 suspected of being dislocations are found only in the region within about 20 nm from the interface between the Si substrate 1 and the annealed SiGeC crystal layer 10 in the matrix SiGeC crystal layer 7. In the other region of the matrix SiGeC crystal layer 7, that is, in the region apart from the interface between the Si substrate 1 and the annealed SiGeC crystal layer 10 by more than 20 nm, defects are hardly found. It is known that in general when a structure of a mere SiGe crystal deposited on a Si substrate is annealed, a large through dislocation and the like are generated. FIG. 7 is a TEM micrograph taken after annealing of a SiGe crystal formed on a substrate. From FIG. 7, it is found that a through dislocation was generated in the SiGe layer after annealing. Such a defect was not generated at all in the wafer including the SiGeC layer fabricated in this embodiment.

The reason why a large defect such as a through dislocation is not generated will be briefly discussed. The lattice constant of the SiC microcrystals and the lattice constant of the SiGeC crystal having a low C content surrounding the Sic microcrystals are greatly different from each other (presumably, by about 20%). Therefore, defects too minute to be recognized in the TEM micrograph shown in FIG. 6 are presumably formed between the SiC microcrystals and the surrounding SiGeC crystal having a low C content. With the existence of such minute defects, presumably, the strain in the matrix SiGeC crystal layer 7 is gradually relieved, resulting in proceeding to the entire lattice relieving without generation of a large defect such as a through dislocation.

The upper spectrum in FIG. 4 shows the results of X-ray diffraction of the substrate after the annealing (see FIG. 3B).

The peak appearing at 33.95 degree corresponds to a diffraction peak caused by the SiGeC crystal layer 7. From close analysis using the peak angle and Vegard's Law, it is found that relieving occurred in the matrix SiGeC crystal layer 7 and the interstitial distance in the plane of the matrix SiGeC crystal layer 7 is about 0.5494 nm, which is larger than the lattice constant of Si by about 0.6%. Strictly speaking, this value covers only the matrix SiGeC crystal layer 7, and is not the lattice constant of the annealed SiGeC crystal layer 10 including the SiC microcrystals. However, since the volume proportion of the SiC microcrystals is considerably small as described above, this value can be regarded equal to the lattice constant of the annealed SiGeC crystal layer 10.

From the above discussion, it is understood that the structure of the present invention, which includes the Si substrate and the SiGeC crystal layer with SiC crystals dispersed therein, functions as the relieved buffer layer having a reduced defect. In the wafer fabricated in this embodiment, defects of the crystal structure generated only in the region within 20 nm from the interface between the Si substrate 1 and the annealed SiGeC crystal layer 10 in the matrix SiGeC crystal layer 7. In view of this, it is also found that a wafer free from a defect such as a through dislocation can be fabricated by only forming a deposited layer considerably thinner than that formed in this embodiment.

Next, the case of forming a strained Si layer using the relieved buffer layer described above will be described.

Figure 3D:
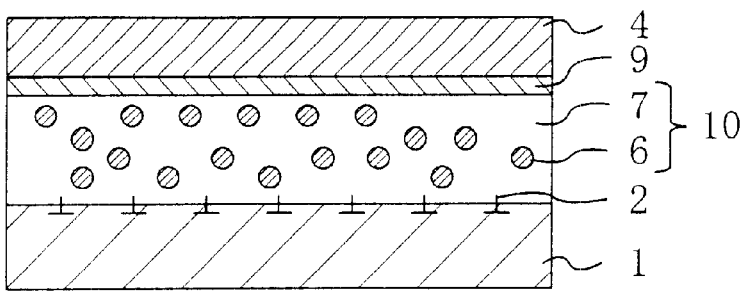

In the step shown in FIG. 3D, the surface of the substrate including the Si substrate 1, the annealed SiGe crystal layer 10, and the Si crystal layer 9 is cleaned in substantially the same manner as that adopted in the step shown in FIG. 3A. The substrate is then put in the UHV-CVD apparatus, and the cleaned substrate surface is exposed inside. The substrate temperature is set at 550° C. A $Si_2H_6$ gas is fed at a pressure of $3.2 \times 10^{-2}$ Pa ($2.4 \times 10^{-4}$ Torr) for 15 minutes, to epitaxially grow a Si crystal layer having a thickness of about 30 nm on the Si crystal layer 9.

As will be described later, the annealed SiGeC crystal layer 10 and the Si crystal layer 9 are greater in the lattice constant in the plane than the Si substrate 1. Therefore, the newly deposited Si crystal layer has a lattice constant greater than the Si substrate 1 and therefore constitutes the strained Si crystal layer 4 that has strain. Thus, through the steps described above, a semiconductor substrate including a strained Si crystal layer is fabricated.

By using the wafer including the strained Si crystal layer 4, a semiconductor device superior in performance to the conventional semiconductor device using a Si crystal can be fabricated. For example, this makes it possible to fabricate a field effect transistor having a Si/SiGeC heterostructure in which a gate oxide film and a gate electrode are formed on the strained Si crystal layer 4.

According to the method for fabricating a semiconductor wafer of the embodiment of the present invention, in which the thickness of the relieved buffer layer is as small as 130 nm, the time and cost required for fabrication can be widely reduced compared with the conventional method. This permits mass-production of the semiconductor wafer including the strained Si crystal layer 4.

In this embodiment, the annealing is performed after the deposition of the SiGeC crystal layer 8 on the Si substrate 1 and before the deposition of the Si crystal layer. Alternatively, the annealing may be performed after the deposition of the Si crystal layer on the SiGeC crystal layer 8. By this alternative method, also, it is possible to fabricate a semiconductor wafer including the strained Si crystal layer 4.

Hereinafter, the crystal state of the annealed SiGeC crystal layer 10 and the strained Si crystal layer 4 on the Si substrate 1 formed in this embodiment is discussed.

Figure 5:
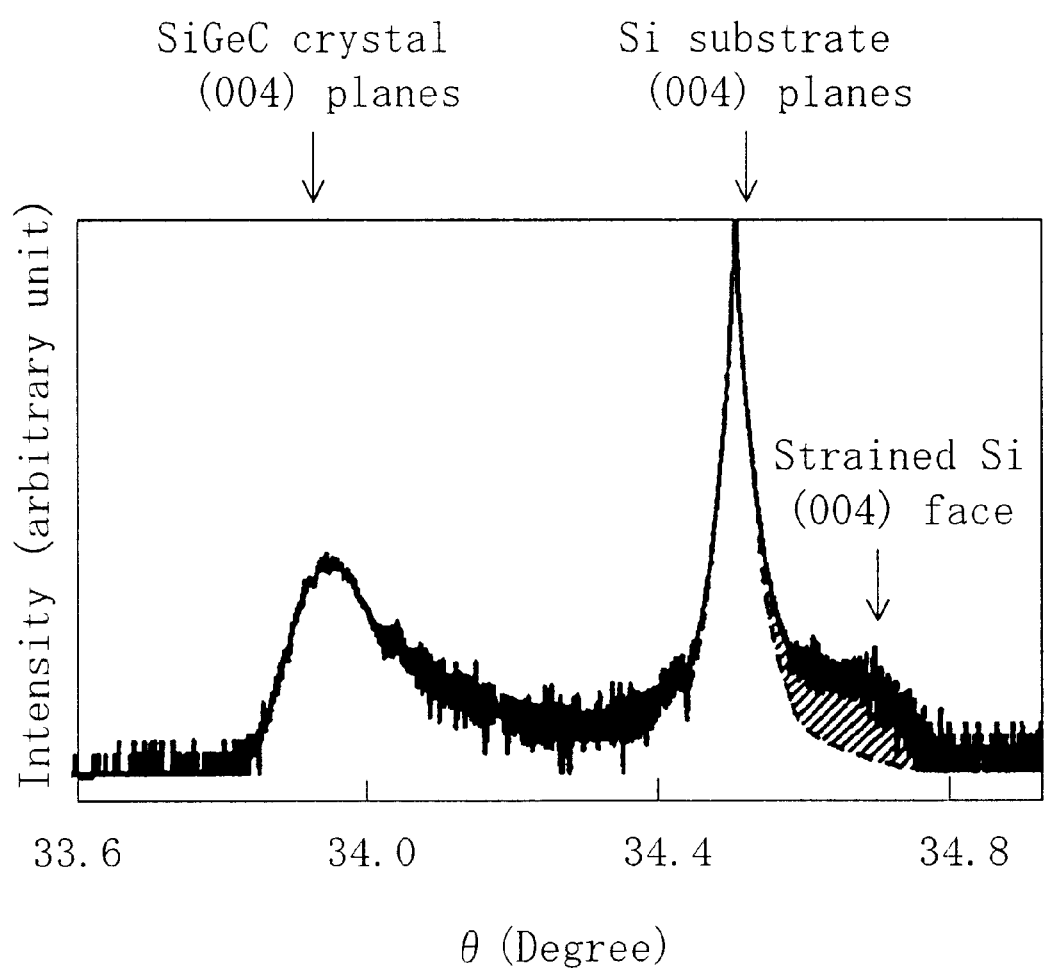
FIG. 5 is a view showing X-ray diffraction spectrum of the Si substrate including the strained Si crystal layer on the relieved buffer layer proposed in the present invention.

FIG. 5 is a view showing the results of measurement of an x-ray diffraction spectrum of the Si substrate 1 with the annealed SiGeC crystal layer 10 and the strained Si crystal layer 4 formed thereon. From FIG. 5, it is found that, in addition to the diffraction peak of the Si substrate 1 near 34.56 degree and the diffraction peak of the relieved SiGeC crystal (annealed SiGeC crystal layer 10) near 33.95 degree, a weak broad peak is observed near 34.7 degree. This peak near 34.7 degree is considered to have appeared because the Si crystal layer, which was deposited on the annealed SiGeC crystal layer 10 having a lattice constant in the plane greater than the Si substrate 1, received tensile stress and thus strained. From analysis using Vegard's Law, it is found that the in-plane lattice constant of the strained Si crystal layer 4 is about 0.5458 nm. Since the interstitial distance of the Si substrate 1 (bulk Si crystal) is 0.5431 nm, the Si crystal layer 4 has a strain of about 0.5%. From the above results, it is found that a strained Si crystal also can be formed by depositing a Si crystal on the SiGeC crystal layer including SiC crystals dispersed therein.

INDUSTRIAL APPLICABILITY

The present invention is applicable to a field effect transistor that has a Si/SiGeC heterostructure and includes a strained Si crystal, and the like.

What is claimed is:

1. A method for fabricating a semiconductor wafer, comprising the steps of:
   (a) depositing a SiGeC crystal layer on a Si substrate, the SiGeC crystal layer having each lattice constant in the plane parallel to the Si substrate that matches with a lattice constant of the Si substrate;
   (b) phase-separating the SiGeC crystal layer into SiC microcrystals and a matrix SiGeC crystal layer by annealing the Si substrate, and increasing a lattice constant in the plane of the matrix SiGeC crystal layer to become greater than the lattice constant of the Si substrate; and
   (c) growing a strained Si crystal layer on the matrix SiGeC crystal layer, a lattice constant in the plane of the strain Si crystal layer is the same as the lattice constant in the plane of the matrix SiGeC crystal layer.

2. The method of claim 1, wherein in the step (a), the thickness of the deposited SiGeC crystal layer is 20 nm or more.

3. The method of claim 1, wherein the step (b), the annealing is performed at a temperature of 950° C. or more.

4. The method of claim 2, wherein in the step (b), the annealing is performed at a temperature of 950° C. or more.

5. The method of claim 1, wherein in the step (b), the annealing is performed in a nitrogen atmosphere.

6. The method of claim 1, wherein in the step (a), the deposition of the SiGeC crystal layer is performed in a crystal growth apparatus, and wherein after the step (a), the Si substrate is taken out of the crystal growth apparatus before performing the annealing of the step (b).

7. The method of claim 1, wherein in the step (a), the deposition of the SiGeC crystal layer is performed in a crystal growth apparatus, and wherein after the step, the annealing of the Si substrate in the step (b) is performed in the crystal growth apparatus.

8. The method of claim 2, wherein after the step (b), dislocation defects are found only in a region in the matrix SiGeC crystal layer less than about 20 nm from the interface between the Si substrate and the matrix SiGeC crystal layer.

9. The method of claim 8, wherein after the step (b), no dislocation defect is found in a region in the matrix SiGeC crystal layer 20 nm or more from the interface between the Si substrate and the matrix SiGeC crystal layer.

10. The method of claim 1, wherein the step (c) is performed after the step (a), and the annealing of step (b) is performed after the step (c).

* * * * *

UNITED STATES PATENT AND TRADEMARK OFFICE
CERTIFICATE OF CORRECTION

PATENT NO.    : 6,645,836 B2
DATED         : November 11, 2003
INVENTOR(S)   : Yoshihiko Kanzawa et al.

It is certified that error appears in the above-identified patent and that said Letters Patent is hereby corrected as shown below:

<u>Title page,</u>
Item [75], Inventors, delete "Yoshihiko Kanzawa, Kadoma (JP)" insert
-- Yoshihiko Kanzawa, Osaka (JP) --; delete "Tohru Saitoh, Settsu (JP)" insert
-- Tohru Saitoh, Osaka (JP) --; and delete "Minoru Kubo, Nabari (JP)" insert
-- Minoru Kubo, Mie (JP) --;
Item [22], PCT Filed:, delete "May 27, 2001" insert -- March 27, 2001 --.

Signed and Sealed this

Eleventh Day of May, 2004

JON W. DUDAS
*Acting Director of the United States Patent and Trademark Office*